United States Patent
Becker et al.

(10) Patent No.: US 11,563,130 B2
(45) Date of Patent: Jan. 24, 2023

(54) OPTICAL SENSOR WITH INTEGRATED PINHOLE

(71) Applicant: Texas Instruments Incorporated, Dallas, TX (US)

(72) Inventors: James Becker, Sunnyvale, CA (US); Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 3 days.

(21) Appl. No.: 16/867,309

(22) Filed: May 5, 2020

(65) Prior Publication Data

US 2020/0266306 A1 Aug. 20, 2020

Related U.S. Application Data

(63) Continuation of application No. 16/042,020, filed on Jul. 23, 2018, now Pat. No. 10,644,173, which is a
(Continued)

(51) Int. Cl.
*H01L 31/0232* (2014.01)
*H01L 31/02* (2006.01)
*H01L 31/103* (2006.01)

(52) U.S. Cl.
CPC .. *H01L 31/02327* (2013.01); *H01L 31/02024* (2013.01); *H01L 31/103* (2013.01)

(58) Field of Classification Search
CPC ......... H01L 31/02327; H01L 31/02024; H01L 31/103
See application file for complete search history.

(56) References Cited

U.S. PATENT DOCUMENTS 4,011,016 A * 3/1977 Layne ................... H01L 31/103
356/402
5,654,565 A 8/1997 Hokari
(Continued)

OTHER PUBLICATIONS

OPT3001 datasheet:http://www.ti.com/product/OPT3001/datasheet/mechanical_packaging_and_orderable_information, pp. 43, Dec. 2014.
(Continued)

*Primary Examiner* — Su C Kim
(74) *Attorney, Agent, or Firm* — John R. Pessetto; Frank D. Cimino

(57) ABSTRACT

An optical sensor includes a semiconductor substrate having a first conductive type. The optical sensor further includes a photodiode disposed on the semiconductor substrate and a metal layer. The photodiode includes a first semiconductor layer having the first conductive type and a second semiconductor layer, formed on the first semiconductor layer, including a plurality of cathodes having a second conductive type. The first semiconductor layer is configured to collect photocurrent upon reception of incident light. The cathodes are configured to be electrically connected to the first semiconductor layer and the second semiconductor layer is configured to, based on the collected photocurrent, to track the incident light. The metal layer further includes a pinhole configured to collimate the incident light, and the plurality of cathodes form a rotational symmetry of order n with respect to an axis of the pinhole.

14 Claims, 3 Drawing Sheets

Related U.S. Application Data continuation of application No. 14/157,891, filed on Jan. 17, 2014, now Pat. No. 10,069,023.

(60) Provisional application No. 61/754,348, filed on Jan. 18, 2013.

(56) References Cited

U.S. PATENT DOCUMENTS

| | | | |
|---|---|---|---|
| 6,943,887 B2 | 9/2005 | Quinn et al. | |
| 8,520,104 B2 * | 8/2013 | Fossum | H01L 27/14641 |
| | | | 348/294 |
| 8,716,821 B2 | 5/2014 | Edwards et al. | |
| 8,742,523 B2 | 6/2014 | Edwards et al. | |
| 9,212,992 B2 | 12/2015 | McNutt | |
| 10,069,023 B2 * | 9/2018 | Becker | H01L 31/02024 |
| 10,644,173 B2 * | 5/2020 | Becker | H01L 31/02327 |
| 2002/0135035 A1 | 9/2002 | Yamaguchi | |
| 2006/0145207 A1 | 7/2006 | Kim et al. | |
| 2007/0080419 A1 | 4/2007 | Shizukuishi | |
| 2009/0057735 A1 | 3/2009 | Beak et al. | |
| 2009/0243016 A1 | 10/2009 | Kawahara et al. | |
| 2009/0284731 A1 | 11/2009 | Jin et al. | |
| 2010/0148040 A1 | 6/2010 | Sanfilippo | |
| 2011/0254118 A1 | 10/2011 | Shafi et al. | |
| 2013/0207168 A1 | 8/2013 | Edwards et al. | |
| 2014/0021378 A1 | 1/2014 | McNutt | |
| 2015/0145097 A1 | 5/2015 | Basu et al. | |

OTHER PUBLICATIONS

PIN diode, Wikipedia, the free encyclopedia, https://en.wikipedia.org/wiki/PIN_diode, pp. 5.

Latchup, Wikipedia, the free encyclopedia, https://en.wikipedia.org/wiki/Latchup, pp. 4.

* cited by examiner

OPTICAL SENSOR WITH INTEGRATED PINHOLE

CROSS-REFERENCE TO RELATED APPLICATIONS

This continuation application claims priority to U.S. patent application Ser. No. 16/042,020, filed Jul. 23, 2018 (now U.S. Pat. No. 10,644,173), which claims priority to U.S. patent application Ser. No. 14/157,891, filed Jan. 17, 2014 (now U.S. Pat. No. 10,069,023), which application claims the benefit of and priority to U.S. Provisional Application 61/754,348, filed Jan. 18, 2013, all of which are hereby incorporated herein by reference in their entirety.

BACKGROUND

A pinhole is widely used as a component to direct or collimate incident light in an optical system. In the semiconductor industry, to fabricate a high-speed, high-efficiency optical sensor by complementary metal oxide semiconductor (CMOS)-compatible technologies has drawn much research effort. However, to integrate the pinhole in the optical sensor generally requires an additional fabrication step, frequently non-CMOS-compatible, or/and an additional component to reach an optimal performance of the optical sensor.

SUMMARY

Systems and a method to integrate a pinhole with a photodiode in an optical sensor are disclosed herein. In an embodiment, an optical sensor includes a semiconductor substrate, a photodiode formed on the semiconductor substrate, and a metal layer formed over the photodiode opposite the semiconductor substrate. The semiconductor substrate has a first conductive type. The photodiode further includes an epitaxial semiconductor layer having the first conductive type, and a plurality of cathodes, formed on the epitaxial semiconductor layer, having a second conductive type opposite from the first conductive type. The epitaxial semiconductor layer is configured to generate current responsive to reception of incident light. The cathodes are configured to make electrical connections to the epitaxial semiconductor layer and, based on the generated current, to track the incident light. Further, the metal layer includes a pinhole which is configured to collimate the incident light. Still further, the plurality of cathodes form a rotational symmetry of order n with respect to an axis of the pinhole.

In another embodiment, an optical sensor includes a semiconductor substrate having a first conductive type, a photodiode disposed on the semiconductor substrate, and a metal layer. The photodiode further includes a first semiconductor layer having the first conductive type and a second semiconductor layer. The first semiconductor layer is configured to collect photocurrent upon reception of incident light. The second semiconductor layer includes a plurality of cathodes having a second conductive type, and the second semiconductor layer is formed on the first semiconductor layer. The cathodes are configured to be electrically connected to the first semiconductor layer and based on the collected photocurrent, the cathodes are configured to track the incident light. Further, the metal layer is formed on the second semiconductor layer and the metal layer includes a shadow mask configured to collimate the incident light. Still further, the plurality of cathodes are n-fold rotationally symmetric based on an axis of the shadow mask.

In accordance with a further embodiment, a method to form a semiconductor device is disclosed. The method includes forming an epitaxial semiconductor layer on a semiconductor substrate, forming a plurality of cathodes on the epitaxial semiconductor layer, and forming a metal layer over the plurality of cathodes opposite the semiconductor substrate. The epitaxial semiconductor layer has a first conductive type, while the plurality of cathodes have a second conductivity type. Further, the plurality of the cathodes are formed by ion-implanting dopants. In a preferred embodiment, the metal layer including a pinhole is formed by a semiconductor process.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
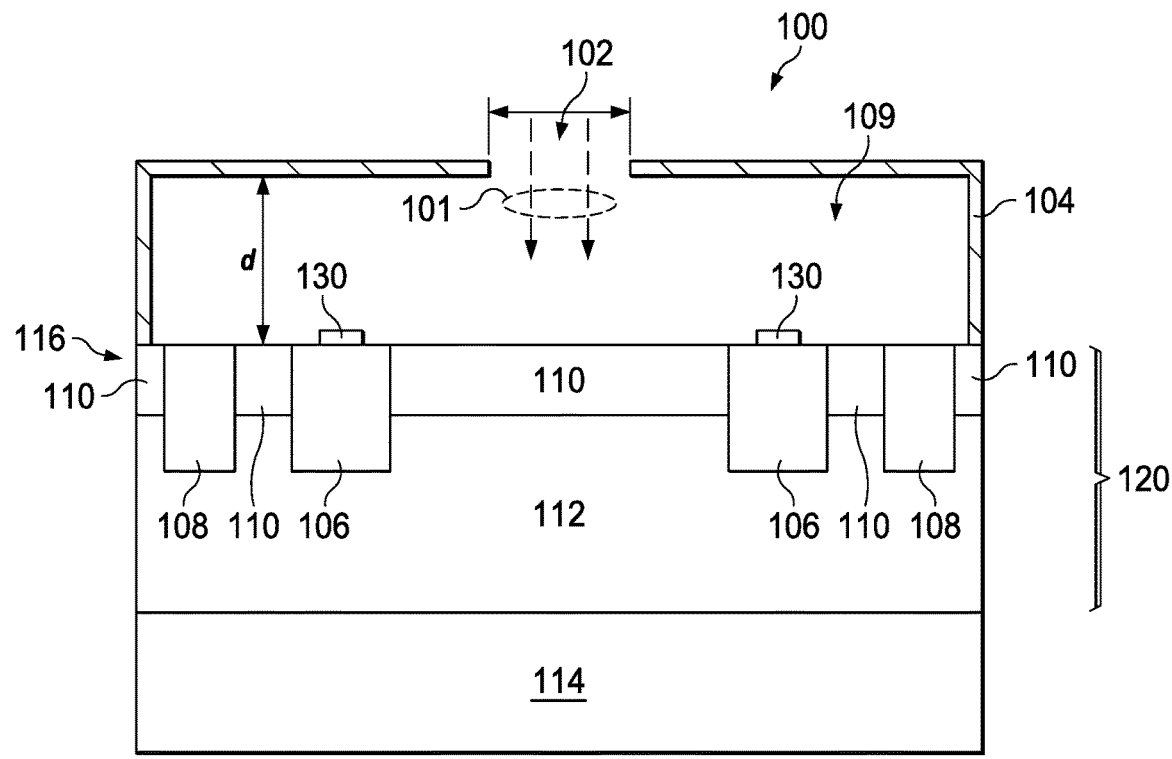
FIG. 1 shows a cross-sectional view of an optical sensor with an integrated pinhole in accordance with some embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A photodiode used in an optical sensor to precisely recognize patterns of motion has gained its importance in a variety of product types, including cell phones, entertainment consoles, medical and military instruments. For example, a video game console may use the optical sensor to provide the video game console functionalities of motion capture, gesture recognition and facial recognition. In a preferred embodiment, an optical sensor may be an image sensor.

In a typical optical sensor, a segmented photodiode, including continuous-type and split-cell type photodiodes, is widely used to track motion of an object, but the segmented usually requires an additional focused light source to be installed on the object. Further, the additional light source needs to be precisely aligned with an active region of the segmented photodiode, which increases complexity of fabrication, and in turn, potentially increases the cost.

Thus, it may be desirable to have an optical sensor comprising a photodiode which is capable of detecting a bright object such as a low-cost light emitting diode (LED), and at the same time, requires no additional light source. Embodiments of the present invention provide a structure and a method for an optical sensor wherein the optical sensor includes a photodiode with an integrated pinhole fabricated by fully complementary metal oxide semiconductor (CMOS)-compatible processes. The disclosed present structure and method implement a high-sensitivity, high-speed optical sensor. By "high-sensitivity" it is meant an optical sensor exhibits a high sensitivity to an incident angle. By "high-speed" it is meant that an optical sensor exhibits a short response time.

FIG. 1 illustrates a cross-sectional view of an exemplary optical sensor 100 including a photodiode 120 with an integrated pinhole 102 in accordance with preferred embodiments. The optical sensor 100 is formed on an initial substrate 114 including, for example, a p-type semiconductor material. In a preferred embodiment, the semiconductor material for the initial substrate 114 may be single-crystal Si, but the material may include other type of materials, such as Ge, SiGe, GaAs, InAs, SiGeC, GaN, or SiC. The photodiode 120 formed on the substrate 114 includes an epitaxial semiconductor layer 112, a plurality of cathodes 106, guard rings 108, and anodes 110. The epitaxial layer 112 may be a p-type epitaxial Si layer. The cathodes 106 may be formed of n-type Si, and the anodes 110 may be formed of p-type Si. More specifically, the cathodes 106 are electrically connected not only to the epitaxial layer 112 but also to a plurality of electrodes 130. The electrodes are configured to collect current from the cathodes 106. Further, the optical sensor 100 includes a top layer 104 with a pinhole 102 formed therein. In some embodiments, the top layer 104 is formed of metal. Candidate materials for the top layer include, but are not limited to, Al, Cu, Ti, TiN, Pt, W, Ta, TaN, Indium tin oxide (ITO) and combinations or alloys thereof. In some embodiments, as shown in FIG. 1, the top layer 104 may be lifted, by a layer 109 with a distance d, over the layer 116 comprising the plurality of cathodes 106, or may be in conjunction with (not shown) the layer 116 comprising the cathodes 106. The distance d may range from several nanometers to micrometers. In some preferred embodiments, the layer 109 may be formed of silicon dioxide.

Still referring to FIG. 1, to operate the optical sensor 100, incident light 101 passes through the pinhole 102 to cause a photo-response on the photodiode 120. In some preferred embodiments, the pinhole 102 may be configured to collimate the incident light 101 for purposes of causing the incident light 101 to be aligned in a preferred direction. The incident light 101 may be generated by an object to be tracked by the optical sensor 100 or sunlight if the optical sensor 100 is used as a solar position tracker. After the collimated incident light 101 illuminates the photodiode 120, electron-hole pairs, also referred to as photo-generated electrons and photo-generated holes, are generated in the epitaxial layer 112. The electrons generated in the p-type epitaxial layer 112 are minority carriers. The generated electrons may diffuse to the cathodes 106 and be collected by a detection circuit (not shown) as photocurrent via the electrodes 130, or alternatively recombine with the majority carriers, holes, in the p-type epitaxial layer 112. Optionally, the guard ring 108 may advantageously limit collection of minority carriers outside the photodiode 120. In order to have a high collection efficiency of the generated electrons, so as to have a high-performance photodiode, a suitable design of the cathodes and the integrated pinhole may be desirable.

By using the disclosed structure and method, the optical sensor 100 may advantageously provide a more feasible way, or a more CMOS-compatible way, to integrate a photodiode with a pinhole assembly. Optical sensors in the prior arts may generally need additional components or light source to enable precise operations of the optical sensors. Without additional components mounted or installed on an object to be tracked by the optical sensor, the present embodiment may advantageously provide a high-sensitivity, high-speed optical sensor by tuning designable geometric parameters. Details will be explained below.

Figure 2:
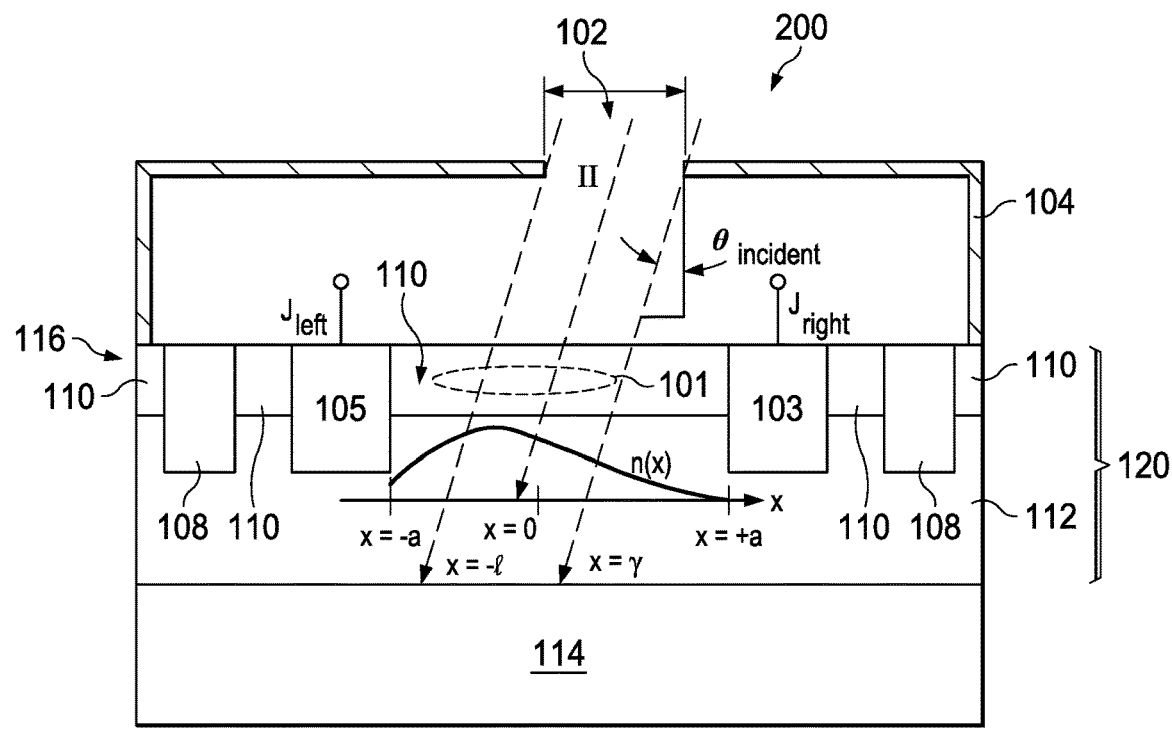
FIG. 2 shows a one-dimensional model of how photocurrent is generated in an optical sensor in accordance with some embodiments.

FIG. 2 shows a one-dimensional physical model of how the photocurrent is generated within the epitaxial layer 112 and collected by the cathodes (e.g., 103 and 105) in the preferred photodiode 120. By "one-dimensional" it is meant that a profile is only extended in one direction. As shown in FIG. 2, the direction refers to as x-axis. In some embodiments, the one-dimensional physical model may be applicable in a two-dimensional (e.g., x-axis and y-axis) or a three-dimensional physical model (e.g., x-axis, y-axis and z-axis).

Still referring to FIG. 2, the incident light 101 illuminates through the pinhole 102 having intensity II, with an incident angle θ. The incident angle, as shown in FIG. 2, is an angle formed by the incident light and an axis normal to the pinhole 102. The photo-generated electrons in the epitaxial layer 112 have a distribution profile of the electron density, n(x), over x-axis. r and I are defined by and correspond to the width of the incident light. For example, in this one-dimensional model, the incident light 101 has a width as shown in FIG. 2; x=r occurs in which the most right of the incident light 101 meets the x-axis, and x=I occurs in which the most left of the incident light 101 meets the x-axis. a is determined by the geometry of the cathodes (e.g., 103 and 105). In this case, if the cathode 103 locates at x=a, and the cathode 105 locates at x=−a, a is determined. Further, x=0 occurs at the midpoint between x=a and x=−a. Based on the principle of continuation, the electron density goes to zero when x equals a or −a, which means that the electrons are collected and diffused via the cathodes 103 and 105.

Based on the diffusion equation in semiconductors, a total current density or photocurrent density, $J_{total}$, and a signal current density, $J_{signal}$, are derived as, $$J_{total} = eII(2w)$$

$$J_{signal} = J_{total}(\delta/a)$$

, where e is the elementary electron charge, and δ and w are mathematical variables (determined by r, θ and I). To be more specifically, as shown in FIG. 2, a current density, $J_{left}$, is collected by the cathode 105 and a current density, $J_{right}$, is collected by the cathode 103. The total current density is, $J_{total} = J_{left} + J_{right}$. The signal current density may be, $J_{signal}=J_{left}-J_{right}$, depending on a surface normal vector being used while measuring. In a preferred embodiment, the signal current density may be a different mix of all the current density components (e.g., $J_{left}$ and $J_{right}$) collected by each of the cathodes (e.g., 103 and 105). Noticeably, the ration between the total current density and the signal current density depends only on geometrical parameters (e.g., a and δ) and is independent of temperature.

According to the derived equations, a response time of the photocurrent generated by the optical sensor 200 is calculated as, $$\tau = \left(\frac{a^2}{2D}\right)\left(1-\left(\frac{\delta}{a}\right)^2 - \frac{1}{3}\left(\frac{w}{a}\right)^2\right)^2$$

, where D is the diffusion coefficient, and δ and w are mathematical variables determined by r and I. The response time is a key metric to measure how efficient of a photodiode's bandwidth for signal modulation. As shown in the equation, the response time strongly depends on the parameter a, which is determined by the geometry of the cathodes. More specifically, an optical sensor with a desired response time is achievable through optimally tuning geometry parameters, a, r and I. For example, if a cell phone using the disclosed optical sensor 200 needs a response time within a specific range, a manufacturer of the cell phone may only need to optimally design the geometry and choose the corresponding parameters which are readily available in CMOS-compatible processes.

An incident angle (e.g., θ) sensitivity is also analyzed based on the same model. The sensitivity of the incident angle is defined as how sensitive the generated photocurrent responds to the incident angle. With a high-sensitivity of the incident angle, an optical sensor may be used more precisely to track an object. As mentioned, by using the same model, the angle sensitivity is only determined by the geometric parameters of the optical sensor and the intensity of the incident light, which enables the optical sensor to be designed and implemented in a more feasible way in accordance with the usage of the optical sensor. Details of the fabrication steps will be illustrated below.

Figure 3:
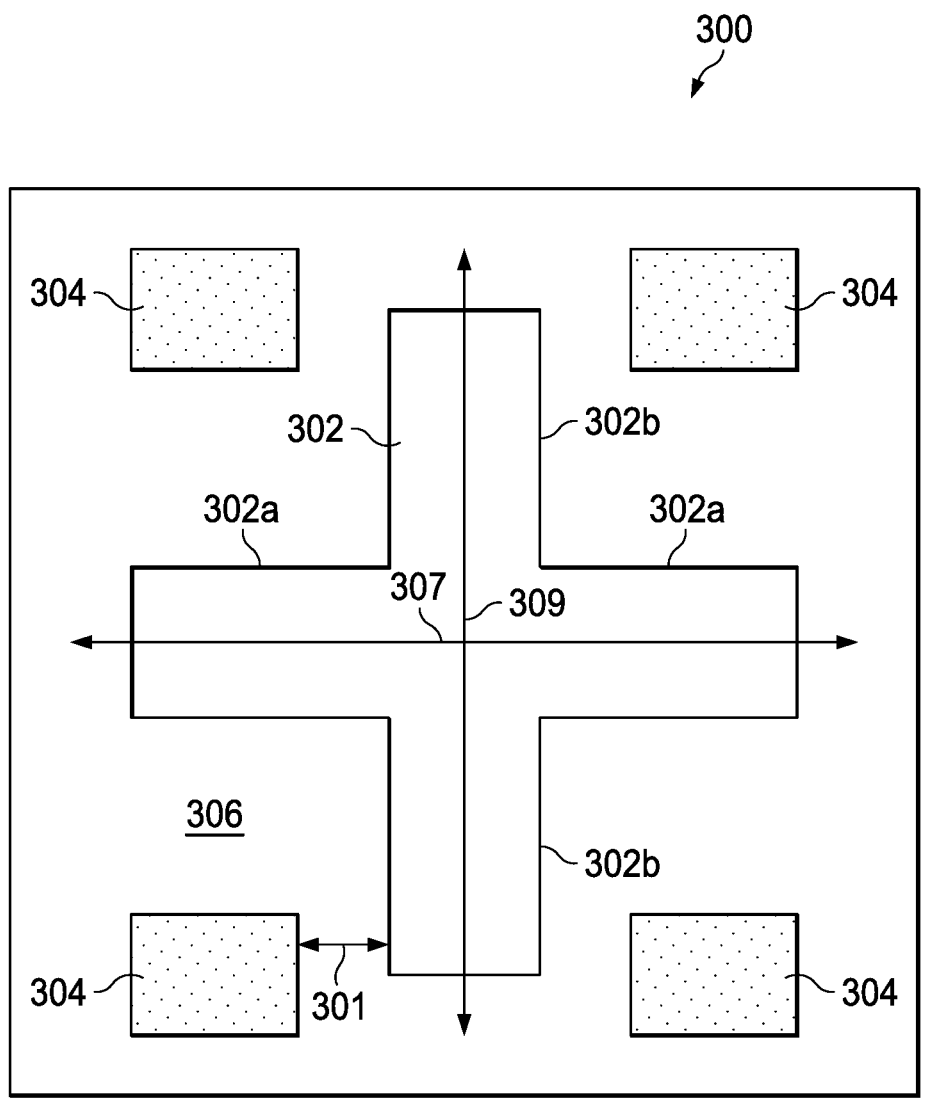
FIG. 3 shows a top-view diagram of an exemplary optical sensor in accordance with some embodiments.

FIG. 3 shows a top-view diagram of an exemplary optical sensor 300. The optical sensor 300 includes a top metal layer 306 having a pinhole 302 and four cathodes (e.g., 304) beneath the metal layer 306. The pinhole 302 of the example of FIG. 3 includes a first pair of extensions 302a and a second pair of extensions 302b. The first and second pairs of extensions are orthogonal to each other, even though the two pairs may be formed non-orthogonally in other embodiments. Further, although the geometrical configuration in FIG. 3 shows that the pinhole 302 has two pairs of extensions 302a and 302b and two cathodes (e.g., 304) on opposite sides of each pair of extensions, the optical sensor 300 may have any suitable geometrical configurations. For example, the pinhole 302 may take the shape of a stripe, a plus sign, a circle, a triangle, or a rectangle. The cathodes 304 may also include an array of dots, triangles, stripes or rectangles. Further, the cathodes 304 may be an array of one-dimensional configurations, two-dimensional configurations, or three-dimensional configurations.

In a preferred implementation, the cathodes (e.g., 304) may form an n-fold rotational symmetry with respect to a particular point or an axis of the pinhole (e.g., 307 and 309), wherein n is an integer. As such, by rotating an angle of 360°/n (e.g., 180°, 120°, 90°, or 60°) with respect to an axis, the plurality of cathodes (e.g., 304) will not be changed. For example, referring to FIG. 3, each of the extensions of the pinhole 302 includes an axis, 307 and 309. The cathodes 304 at upper right and lower right are 2-fold (i.e., n=2) rotationally symmetric to the axis 307, which means that by rotating the upper right cathode 304 and the lower right cathode 304 with respect to the axis 307 360°/2, the configuration of these two cathodes 304 is not changed. Similarly, the upper right and the upper left cathodes 304 are 2-fold rotationally symmetric with respect to the axis 309.

In some embodiments, each of the cathodes (e.g., 304) may be located within a distance 301, as shown in FIG. 3, from the pinhole 302. The distance is defined as a shortest distance measured literally from any point of each of the cathodes (e.g., 304) to the pinhole 302. The distance 301 may not be larger than the electron diffusion length. By implementing this design constraint, a likelihood of low collection efficiency of the photo-generated electrons may be reduced. More particularly, if the distance 301 is larger than the electron diffusion length, the photo-generated electrons generated in the photodiode via illumination under the pinhole 302 may travel over a longer distance, which in turn increases the possibility of recombination of the photo-generated holes and photo-generated-electrons in the photodiode before the photo-generated electrons being collected by the cathodes 304.

Although the optical sensor 300 shown in FIG. 3 includes only a pinhole 302, an active photodiode (not shown) beneath the metal layer 306, and the coupled cathodes 304, in a preferred embodiment, an optical sensor may include an array of a plurality of pinhole integrated sensors (e.g., the optical sensor 300). For example, an optical sensor may include a two-dimensional rectangular array with two optical sensors 300 in a row and three optical sensors 300 in a column. A shape of the array may take any suitable configuration in one-dimension or two-dimension. Each of the optical sensors in the array may be identical, partially identical, or different in terms of an alignment of a pinhole and cathodes.

Figure 4:
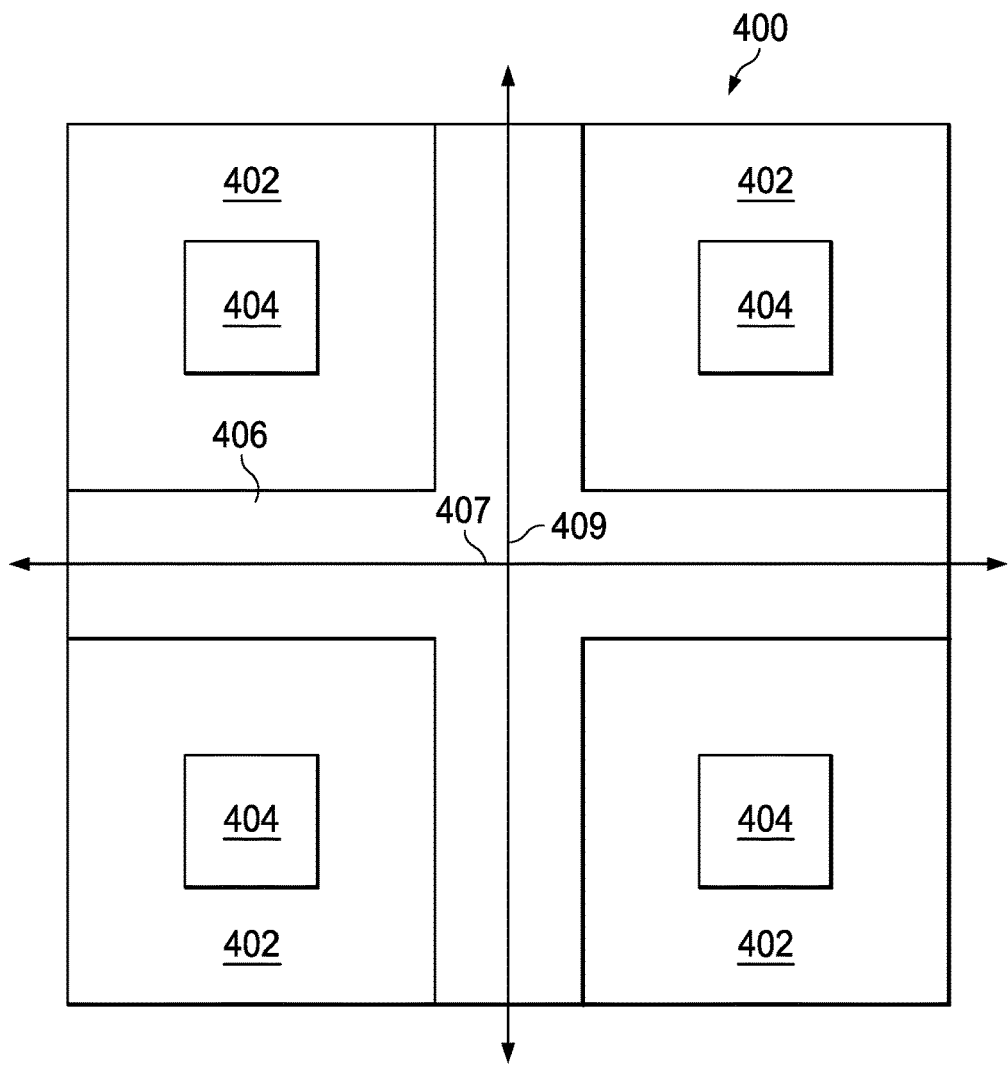
FIG. 4 shows a top-view diagram of an alternate optical sensor in accordance with some embodiments.

In an alternate embodiment, an optical sensor with a configuration of an inverse pinhole may be suitable for some applications. FIG. 4 shows a top-view diagram of an exemplary optical sensor 400 having a shadow mask 406. The shadow mask 406, preferably formed of metal, is an inverse pinhole. For example, in FIG. 4, the configuration of the shadow mask 406 causes a formation of four pinholes 402.

Still referring to FIG. 4, the optical sensor 400 includes the shadow mask 406, pinholes 402, and a plurality of cathodes 404. The shadow mask 406 may be suspended over the layer comprising the plurality of cathodes 404, and depending on a geometrical configuration of the shadow mask 406, the shadow mask 406 may be connected with a plurality of supporting arms at ends of the extensions. For example, in FIG. 4, the shadow mask 406 has two pairs of extensions, and each of the extensions ends at the online of the optical sensor 400 by which the four supporting arms (not shown) connects the shadow mask 406. In a preferred embodiment, analogously to FIG. 3, the cathodes 404 may form an n-fold rotational symmetry with respect to an axis (e.g., 407 and 409) of the shadow mask 406, where n is an integer.

Although the shadow mask 406 in FIG. 4 shows a geometric configuration of a plus shape, the shadow mask 406 may be in any suitable geometric configurations. For example, the shadow mask 406 may have a shape of circle, stripe, square or rectangle. Analogously, the plurality of cathodes 404 may form an array of any suitable geometric configurations as well, including but not limited to dots, rectangles, or stripes.

Figure 5:
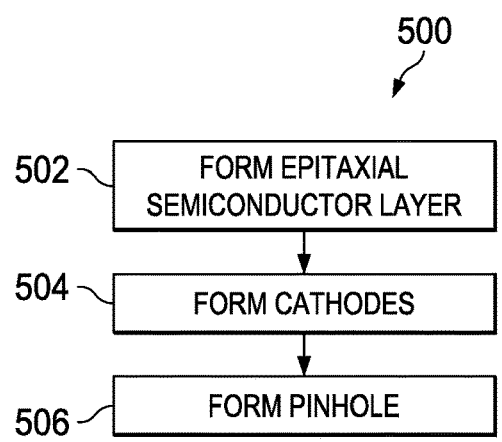
FIG. 5 shows a method to fabricate an optical sensor with an integrated pinhole in accordance with some embodiments.

FIG. 5 shows a method 500 of fabricating the optical sensor of the present invention. The method 500 starts, at step 503, with growing an epitaxial semiconductor layer on a semiconductor substrate. Referring to FIG. 1, the semiconductor substrate 114 may have p-type conductivity, and the epitaxial layer 112 grown on the p-type semiconductor substrate 114 may be p-type with a lower doping density compared to the semiconductor substrate 114. In some preferred embodiments, a net average doping density of the substrate 114 within 100 microns of the epitaxial layer 112 is at least a factor of ten higher than a net average doping density of the epitaxial layer 112. For example, the epitaxial layer may be 2 microns to 30 microns thick.

While other processes to form the epitaxial layer are available, in a preferred embodiment, the epitaxial growth of the epitaxial layer 112 may be implemented using a chemical vapor deposition (CVD) process, which forms a non-volatile solid film on a substrate from reactions of suitable chemical vapors.

Continuing the method 500 with step 504 and still referring to FIG. 1, at step 504, the plurality of cathodes 106 with n-type conductivity, anodes 110 with p-type conductivity, and guard rings 108 are defined and formed in a layer over the grown epitaxial layer by ion-implantation. In a preferred embodiment, the n-type cathodes 106 are formed first via n-type implantation, followed by the formation of p-type anodes 110 via p-type implantation, however the order of the formations could be reversed. The geometrical configurations of the cathodes 106 and the anodes 110 are formed by ion implantation using a photoresist or implant mask or dielectric mask (e.g., silicon dioxide). After implantation of the respective species, the substrate 114 including the cathodes 106 and the anodes 110 may be annealed in order to activate the implants. The annealing may include heating the substrate 114, for example, at 1200° C. for 80 minutes or equivalent conditions, for example, 1225° C. for 50 minutes, 1175° C. for 130 minutes or using rapid thermal processor (RTP) to anneal at 1000° C. for 15 seconds. For the n-type implantation, the preferred dopants to be used are As, P, or Sb, while for the p-type implantation, the preferred dopant is B.

The method 500 continues with step 506 to form the top metal layer 104 comprising the pinhole 102 as shown in FIG. 1. The top layer 104 is formed using a CMOS-compatible process; the process includes: depositing metal, defining a pattern of a pinhole. The depositing may be implemented by a number of means, including, but not limited to evaporation, sputtering, or chemical vapor deposition (CVD). The defining of the patterns of the pinholes can also be implemented by a number of techniques such as lift-off, deposition and etching or chem-mechanical polishing.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An optical sensor, comprising:
a semiconductor substrate having a first conductive type;
a photodiode formed on the semiconductor substrate, the photodiode comprising:
an epitaxial semiconductor layer having the first conductive type;
an anode having the first conductive type and being formed in the epitaxial semiconductor layer, the anode extending to a surface of the epitaxial semiconductor layer; and
a plurality of cathodes having a second conductivity type opposite from the first conductive type and being formed in the epitaxial semiconductor layer, the plurality of cathodes of the second conductivity type extending to the surface of the epitaxial semiconductor layer, the cathodes configured to make electrical connections to the epitaxial semiconductor layer, the optical sensor further comprising:
a metal layer formed over the photodiode opposite the semiconductor substrate and comprising a pinhole,
wherein light does not impinge the cathode of the photodiode.

2. The optical sensor of claim 1, wherein the metal layer is fabricated using an integrated complementary metal oxide semiconductor (CMOS) process.

3. The optical sensor of claim 1, wherein the first conductive type is p-type and the second conductive type is n-type.

4. The optical sensor of claim 1, wherein a distance between each of the plurality of cathodes and the pinhole is not greater than an electron diffusion length.

5. The optical sensor of claim 1, wherein the optical sensor comprises an array of a pinhole integrated sensor, wherein each of the pinhole integrated sensor comprises a plurality of cathodes and a pinhole integrated with the pinhole integrated sensor.

6. The optical sensor of claim 1, wherein the pinhole has a shape of one of a stripe, a plus sign, a circle, a triangle, a rectangle.

7. The optical sensor of claim 1, wherein the plurality of cathodes form an array of dots, triangles, stripes, rectangles.

8. An optical sensor, comprising:
a semiconductor substrate having a first conductive type;
a photodiode disposed on the semiconductor substrate, comprising:
a first semiconductor layer having the first conductive type; and
a second semiconductor layer comprising a plurality of cathodes having a second conductive type and formed on the first semiconductor layer, the cathodes of the second conductivity type extending to a surface of the second semiconductor layer, the cathodes configured to be electrically connected to the first semiconductor layer, the optical sensor further comprising:
a metal layer formed on the second semiconductor layer and comprising a shadow mask configured to allow light to strike the first semiconductor layer;
wherein the light does not impinge the cathode of the photodiode.

9. The optical sensor of claim 8, wherein the metal layer is fabricated using a complementary metal oxide semiconductor (CMOS) process.

10. The optical sensor of claim 8, wherein the first conductive type is p-type and the second conductive type is n-type.

11. The optical sensor of claim 8, wherein the optical sensor comprises an array of a shadow mask integrated sensor, wherein each of the shadow mask integrated sensor comprises a plurality of cathodes and a shadow mask integrated with the shadow mask integrated sensor.

12. The optical sensor of claim 8, wherein the shadow mask has a shape of a stripe, a plus sign, a circle, a triangle, a rectangle.

13. The optical sensor of claim 8, wherein the shadow mask is suspended over the second semiconductor layer and is connected via the metal layer.

14. The optical sensor of claim 8, wherein the plurality of cathodes are an array of one-dimensional configurations, two-dimensional configurations, or three-dimensional configurations.

* * * * *